(12) United States Patent
Jackson et al.

(10) Patent No.: US 8,652,971 B2
(45) Date of Patent: Feb. 18, 2014

(54) CAVITY PROCESS ETCH UNDERCUT MONITOR

(75) Inventors: Ricky Alan Jackson, Richardson, TX (US); Walter Baker Meinel, Tucson, AZ (US); Karen Hildegard Ralston Kirmse, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 135 days.

(21) Appl. No.: 13/411,861

(22) Filed: Mar. 5, 2012

(65) Prior Publication Data

US 2012/0223401 A1    Sep. 6, 2012

Related U.S. Application Data

(60) Provisional application No. 61/449,238, filed on Mar. 4, 2011.

(51) Int. Cl.
*H01L 21/461* (2006.01)
*H01L 23/544* (2006.01)

(52) U.S. Cl.
USPC ........ 438/739; 438/7; 438/8; 438/16; 438/53; 247/48; 247/E23.179

(58) Field of Classification Search
CPC .................................................. B81C 1/00571
USPC .............. 257/419, 619; 438/7, 8, 16, 53, 739
See application file for complete search history.

(56) References Cited

U.S. PATENT DOCUMENTS

2010/0084707 A1*   4/2010   Wang et al. ................... 257/330

\* cited by examiner

*Primary Examiner* — Stephen W Smoot
*Assistant Examiner* — Pavel Ivanov
(74) *Attorney, Agent, or Firm* — Jacqueline J. Garner; Wade J. Brady, III; Frederick J. Telecky, Jr.

(57) ABSTRACT

A MEMS device having a device cavity in a substrate has a cavity etch monitor proximate to the device cavity. An overlying layer including dielectric material is formed over the substrate. A monitor scale is formed in or on the overlying layer. Access holes are etched through the overlying layer and a cavity etch process forms the device cavity and a monitor cavity. The monitor scale is located over a lateral edge of the monitor cavity. The cavity etch monitor includes the monitor scale and monitor cavity, which allows visual measurement of a lateral width of the monitor cavity; the lateral dimensions of the monitor cavity being related to lateral dimensions of the device cavity.

20 Claims, 16 Drawing Sheets

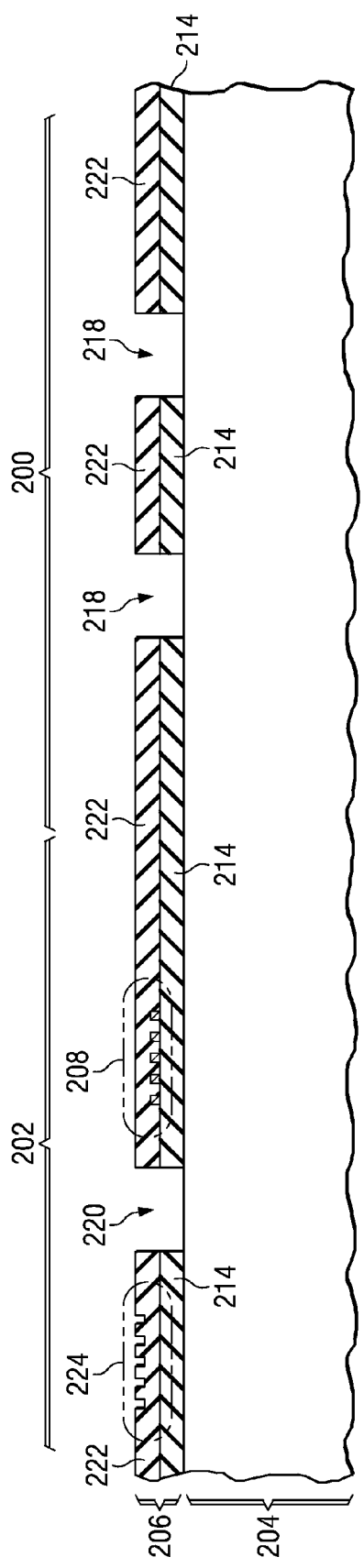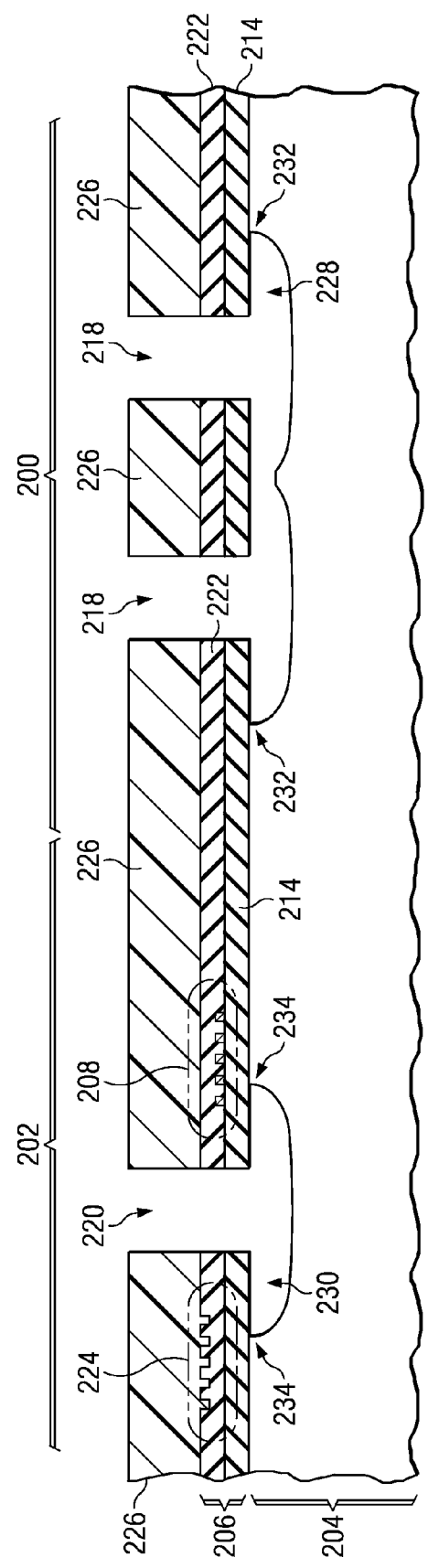

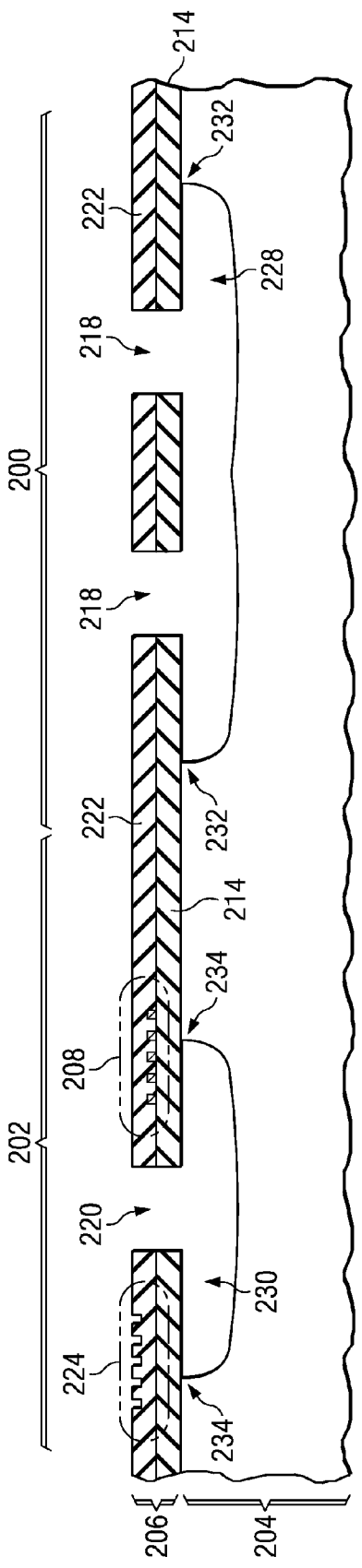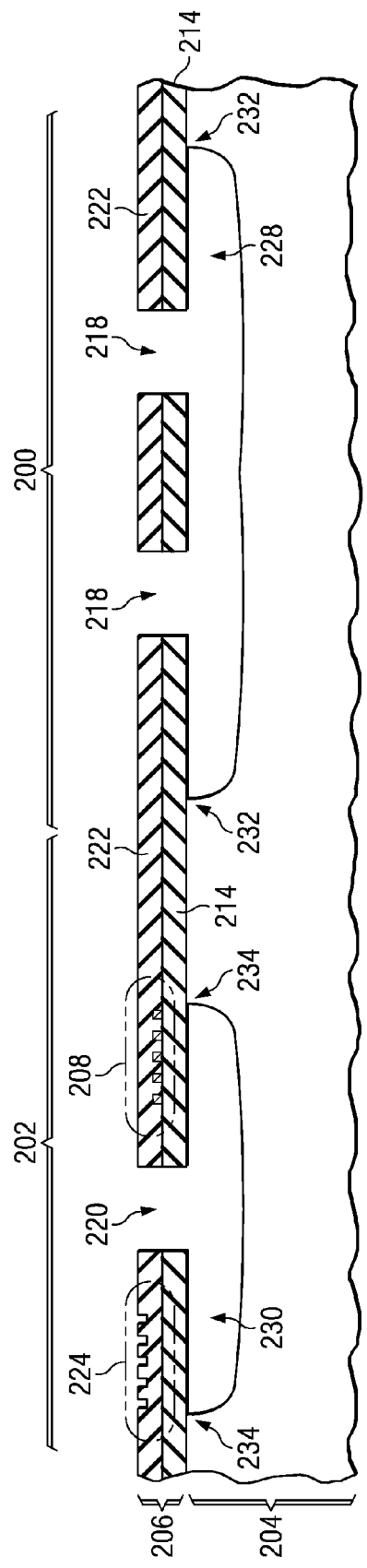

US 8,652,971 B2

CAVITY PROCESS ETCH UNDERCUT MONITOR

CROSS-REFERENCE TO RELATED APPLICATIONS

This application claims the benefit of priority under U.S.C. §119(e) of U.S. Provisional Application 61/449,238, filed Mar. 4, 2011.

The following co-pending patent applications are related and hereby incorporated by reference:

U.S. patent application Ser. No. 13/411,871, filed Mar. 5, 2012 entitled "CAVITY OPEN PROCESS TO IMPROVE UNDERCUT,"

U.S. patent application Ser. No. 13/411,849, filed Mar. 5, 2012 entitled "INFRARED SENSOR DESIGN USING AN EPDXY FILM AS AN INFRARED ABSORPTION LAYER,"

U.S. patent application Ser. No. 13/412,562, filed Mar. 5, 2012 entitled "BACKGRIND PROCESS FOR INTEGRATED CIRCUIT WAFERS," and U.S. patent application Ser. No. 13/412,563, filed Mar. 5, 2012 entitled "SENSOR COVER FOR INTEGRATED SENSOR CHIPS."

FIELD OF THE INVENTION

This invention relates to the field of microelectronic mechanical systems (MEMS) devices. More particularly, this invention relates to three-dimensional structures in MEMS devices.

BACKGROUND OF THE INVENTION

A micromechanical electronic system (MEMS) device may have a cavity in a substrate underlapping an overlying layer. The cavity may be formed using an isotropic etch process through an access hole in the overlying layer. Forming the cavity with lateral dimensions within desired tolerances may be problematic due to interaction of several etching parameters, such as pressure, temperature, concentrations of reactant species, and geometric factors of the cavity with respect to access of the etchants.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A MEMS device with a device cavity in a substrate underlapping an overlying layer may be formed to have a cavity etch monitor proximate to the device cavity which allows visual measurement of lateral dimension of a monitor cavity; the lateral dimensions of the monitor cavity are related to lateral dimensions of the device cavity. The cavity etch monitor includes a monitor scale formed in a transparent region of the overlying layer over the monitor cavity. Visual assessment of a position of a lateral edge of the monitor cavity with respect to the monitor scale provides the visual measurement of the lateral dimension of the monitor cavity.

DESCRIPTION OF THE VIEWS OF THE DRAWING

FIG. 2A through FIG. 2M depict a MEMS device and a cavity etch monitor such as described in reference to FIG. 1, depicted in successive stages of fabrication.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

A MEMS device with a device cavity underlapping an overlying layer may be formed to have a cavity etch monitor proximate to the device cavity which allows visual measurement of lateral dimension of a monitor cavity; the lateral dimensions of the monitor cavity are related to lateral dimensions of the device cavity. The cavity etch monitor includes a monitor scale formed in a transparent region of the overlying layer over the monitor cavity. Visual assessment of a position of a lateral edge of the monitor cavity with respect to the monitor scale provides the visual measurement of the lateral dimension of the monitor cavity.

Figure 1:
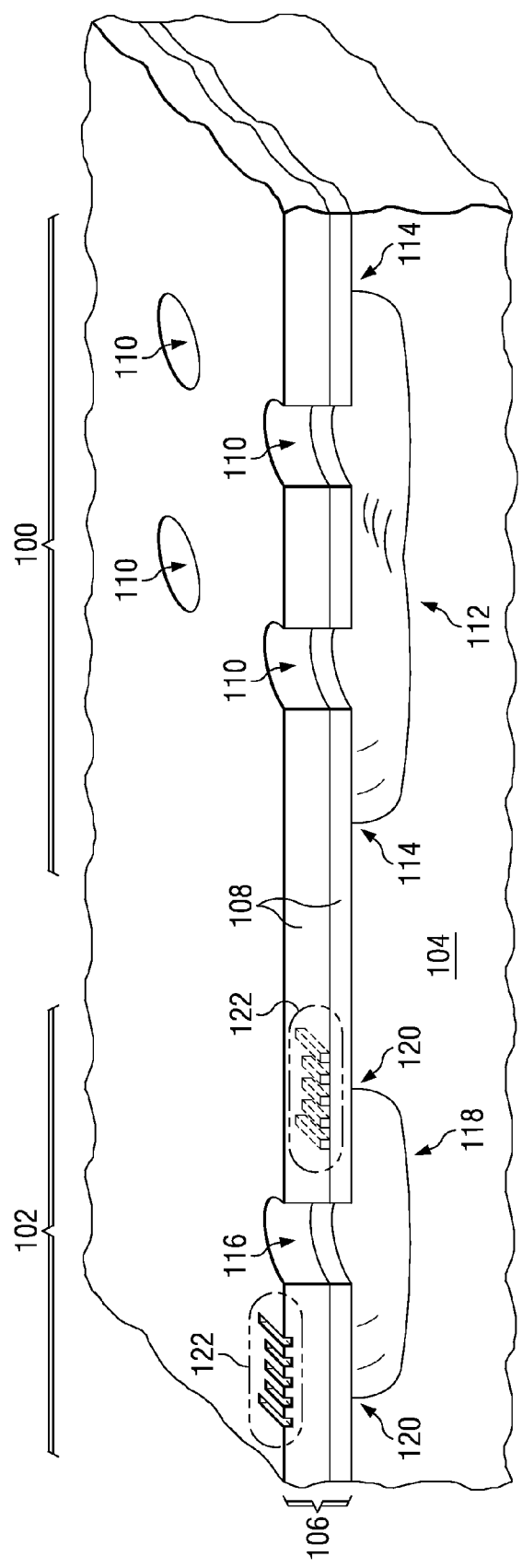
FIG. 1 depicts a MEMS device with a device cavity underlapping an overlying layer and having a cavity etch monitor proximate to the device cavity.

FIG. 1 depicts a MEMS device with a device cavity underlapping an overlying layer and having a cavity etch monitor proximate to the device cavity. The MEMS device 100 and the cavity etch monitor 102 are formed in and on a substrate 104 which may be, for example a silicon wafer. The overlying layer 106 may include, for example, one or more sublayers 108 of silicon dioxide, silicon nitride, silicon oxynitride, aluminum oxide, and/or low-k dielectric materials such as organo-silicate glass (OSG), carbon-doped silicon oxides (SiCO or CDO) or dielectric material formed from methylsilsesquioxane (MSQ), formed by, for example, chemical vapor deposition (CVD), plasma enhanced chemical vapor deposition (PECVD), low pressure chemical vapor deposition (LPCVD), atmospheric pressure chemical vapor deposition (APCVD), high density plasma (HDP), an ozone based thermal chemical vapor deposition (CVD) process, also known as the high aspect ratio process (HARP), or other suitable dielectric layer formation process. The overlying layer 106 may include metal interconnect lines and vias, and active components, not shown, such as thermal sensors or acoustic sensors, for example as part of the MEMS device 100.

The MEMS device 100 includes at least one device access hole 110 through the overlying layer 106 which opens to a device cavity 112 in the substrate 104. The device cavity 112 is disposed under the device access holes 110 and underlaps the overlying layer 106 so that a lateral edge 114 of the device cavity 112 at a bottom surface of the overlying layer 106 extends at least 5 microns past a lateral edge of the device access holes 110.

The cavity etch monitor 102 includes at least one monitor access hole 116 through the overlying layer 106 which opens to a monitor cavity 118 in the substrate 104. The monitor cavity 118 underlaps the overlying layer 106 so that a lateral edge 120 of the monitor cavity 118 at a bottom surface of the overlying layer 106 extends at least 5 microns past a lateral edge of the monitor access hole 116. At least one monitor scale 122 is formed over the lateral edge 120 of the monitor cavity 118. The monitor scales 122 include visible scale indicia, such as metal or polycrystalline silicon lines or etched lines, which can be used to measure a lateral size of the monitor cavity 118. Polycrystalline silicon is commonly referred to as polysilicon. Polysilicon lines may have a layer of metal silicide over the polysilicon. The monitor scales 122 are formed in regions of the overlying layer 106 which are sufficiently transparent so as to allow optical determination of the lateral edge 120 of the monitor cavity 118 with respect to the monitor scales 122.

The cavity etch monitor 102 may be disposed within the MEMS device 100 so that the cavity etch monitor 102 remains proximate to the MEMS device 100 during a subsequent singulation operation which separates the MEMS device 100 from other instances of the MEMS device 100 in and on the substrate 104. Alternately, the cavity etch monitor 102 may be disposed outside of, but proximate to, the MEMS device 100, for example in a scribe line adjacent to the MEMS device 100, so that the cavity etch monitor 102 is separated from the MEMS device 100 during the subsequent singulation operation.

Figure 2A:
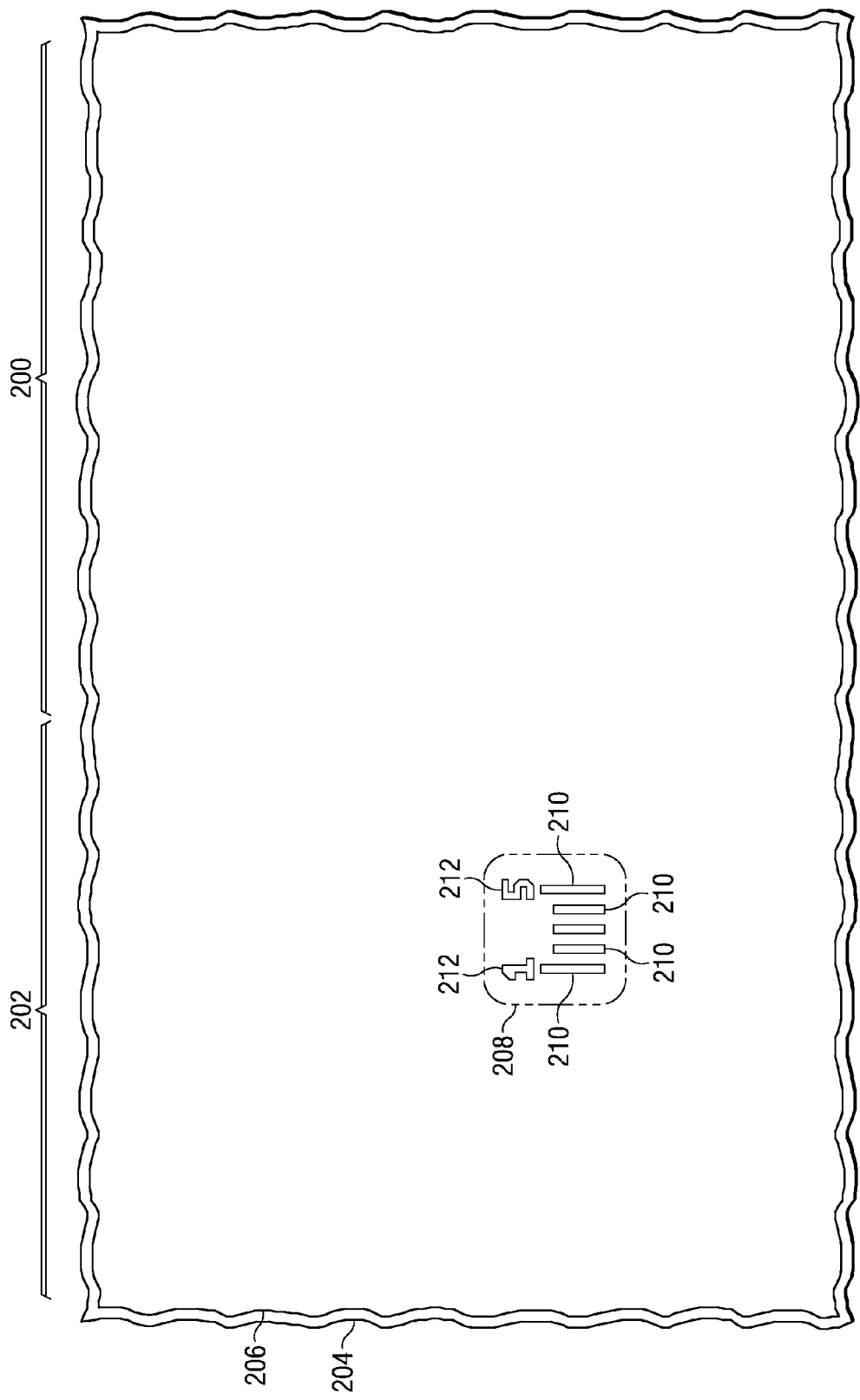

FIG. 2A through FIG. 2M depict a MEMS device and a cavity etch monitor such as described in reference to FIG. 1, depicted in successive stages of fabrication. FIG. 2A is a top view of an area defined for the MEMS device 200 and an area defined for the cavity etch monitor 202, which is formed in and on a substrate 204 as described in reference to FIG. 1. The area defined for the cavity etch monitor 202 may be separate from the area defined for the MEMS device 200 as depicted in FIG. 2A, or the area defined for the cavity etch monitor 202 may be included in the area defined for the MEMS device 200. An overlying layer 206 as described in reference to FIG. 1 is formed over the substrate 204.

A monitor scale 208 is formed over the substrate 204 in or on the overlying layer 206 in an area for a cavity etch monitor. The monitor scale 208 includes scale indicia 210 which may be in a linear configuration as depicted in FIG. 2A or may be arranged in another configuration. The monitor scale 208 may include numbers 212 or other characters or symbols to assist measurement. The monitor scale 208 may be, for example, formed of metal or polysilicon lines or etched into a dielectric layer which provides visual contrast to surrounding material of the overlying layer 206. Processes for forming monitor scales, such as the monitor scale 208, are discussed further hereinbelow.

Figure 2B:
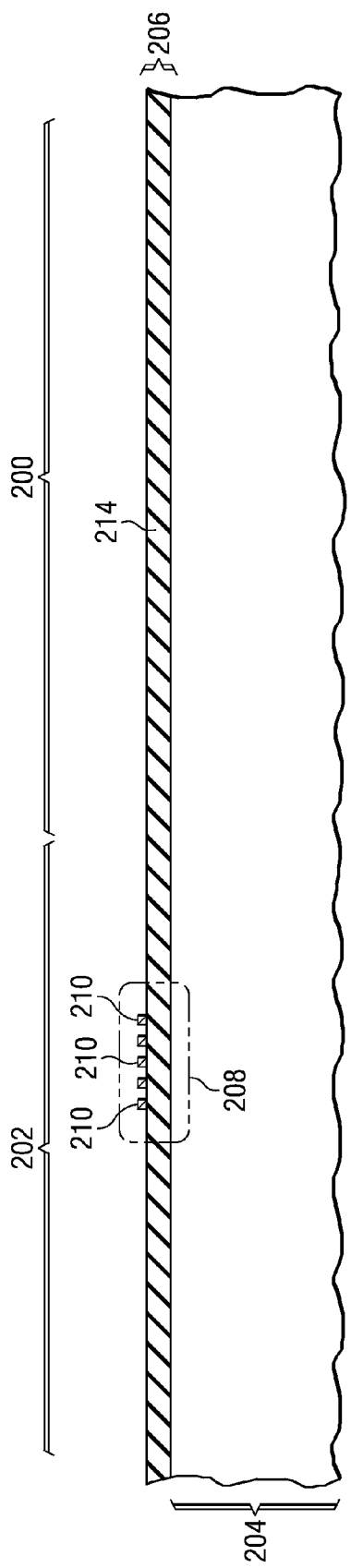

FIG. 2B is a cross section of the MEMS device 200 and the cavity etch monitor 202 at the same stage of fabrication depicted in FIG. 2A. The first monitor scale 208 may be formed on a first sublayer 214 of the overlying layer 206, for example silicon dioxide formed by thermal oxidation of the substrate 204 or silicon nitride formed by low pressure chemical vapor deposition (LPCVD).

Figure 2D:
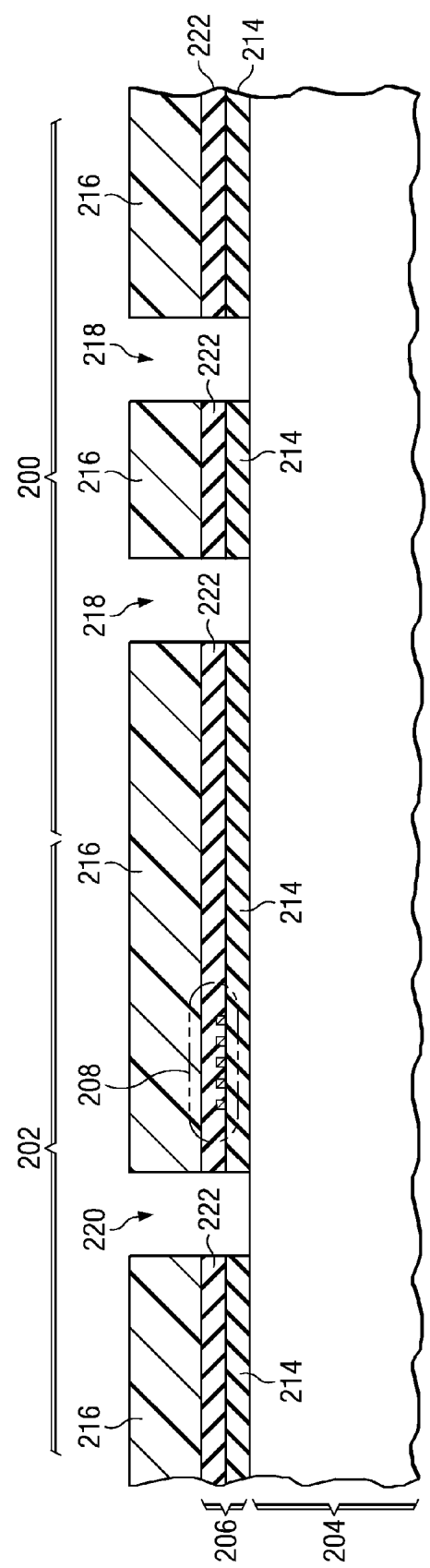
Figure 2C:
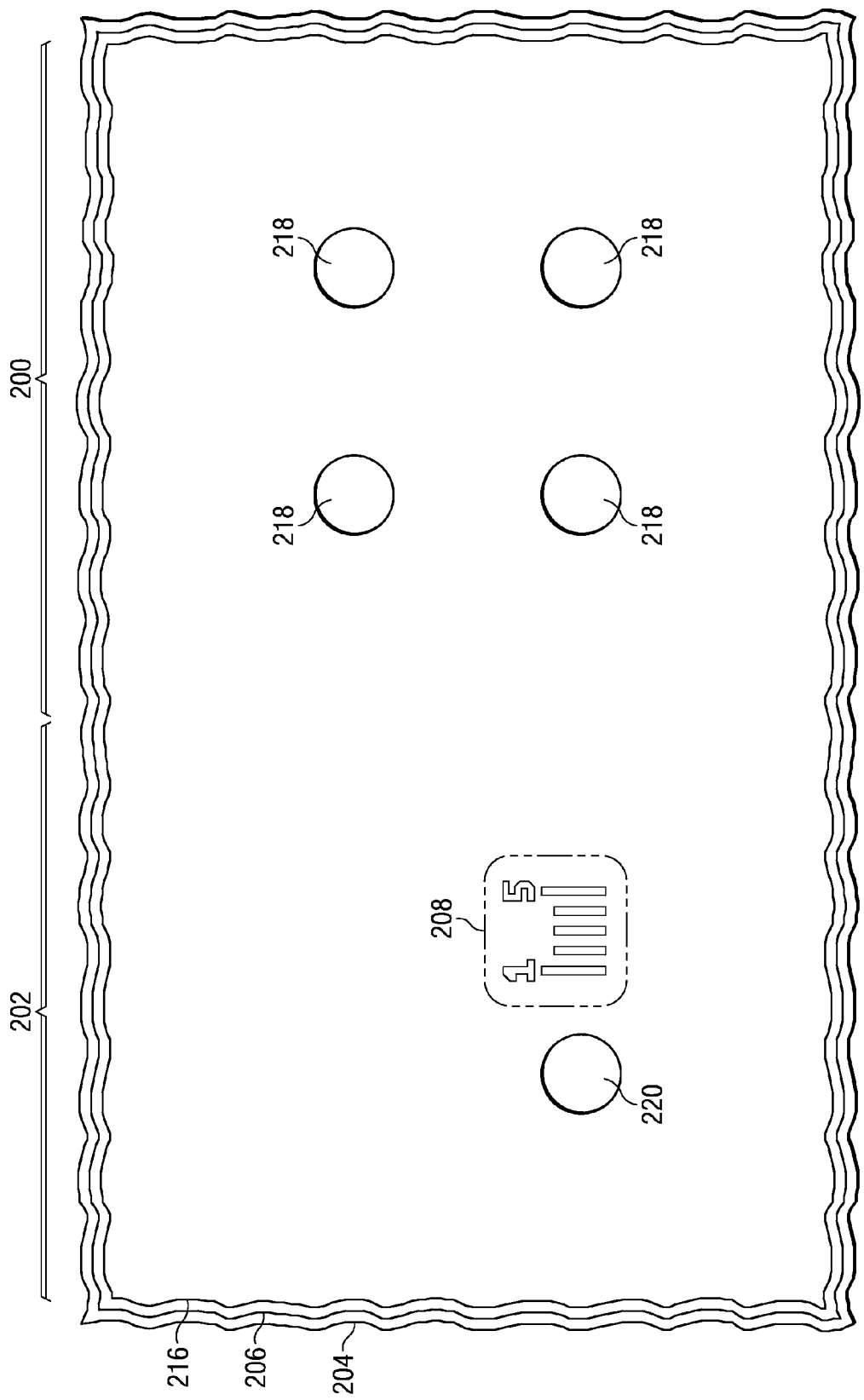

FIG. 2C is a top view of the MEMS device 200 and the cavity etch monitor 202 at a subsequent stage of fabrication. One or more additional sublayers may be formed in the overlying layer 206, covering the first monitor scale 208. An access hole etch mask 216 is formed over the overlying layer 206 so as to expose the overlying layer 206 in areas for at least one device access hole 218 and at least one monitor access hole 220. One instance of the monitor access hole 220 is adjacent to the first monitor scale 208. An access hole etch process is performed which removes material from the overlying layer 206 in the device access hole 218 areas and the monitor access hole 220 area. Diameters of the device access holes 218 may be substantially equal. A diameter of the monitor access hole 220 may be substantially equal to the diameters of the device access holes 218. Alternately, the device access holes 218 may have different diameters or shapes to achieve a desired shape of a device cavity. The monitor access hole 220 may have a different diameter from the device access holes 218 to allow the cavity etch monitor to fit into a desired space.

FIG. 2D is a cross section of the MEMS device 200 and the cavity etch monitor 202 at the same stage of fabrication depicted in FIG. 2C. A second sublayer 222 of the overlying layer 206 may be formed over the first sublayer 214 and over the first monitor scale 208. The access hole etch mask 216 is formed over the overlying layer 206. The access hole etch mask 216 may include photoresist formed by a photolithographic process, and may possibly include a hard mask layer of, for example, silicon nitride or silicon carbide. The access hole etch process may be performed so as to etch down to the top surface of the substrate 204 as depicted in FIG. 2D. Alternatively, the access hole etch process may be performed so as to etch partway through the overlying layer 206. The access hole etch mask 216 may be removed after the access hole etch process is completed, or may be left in place.

Figure 2E:
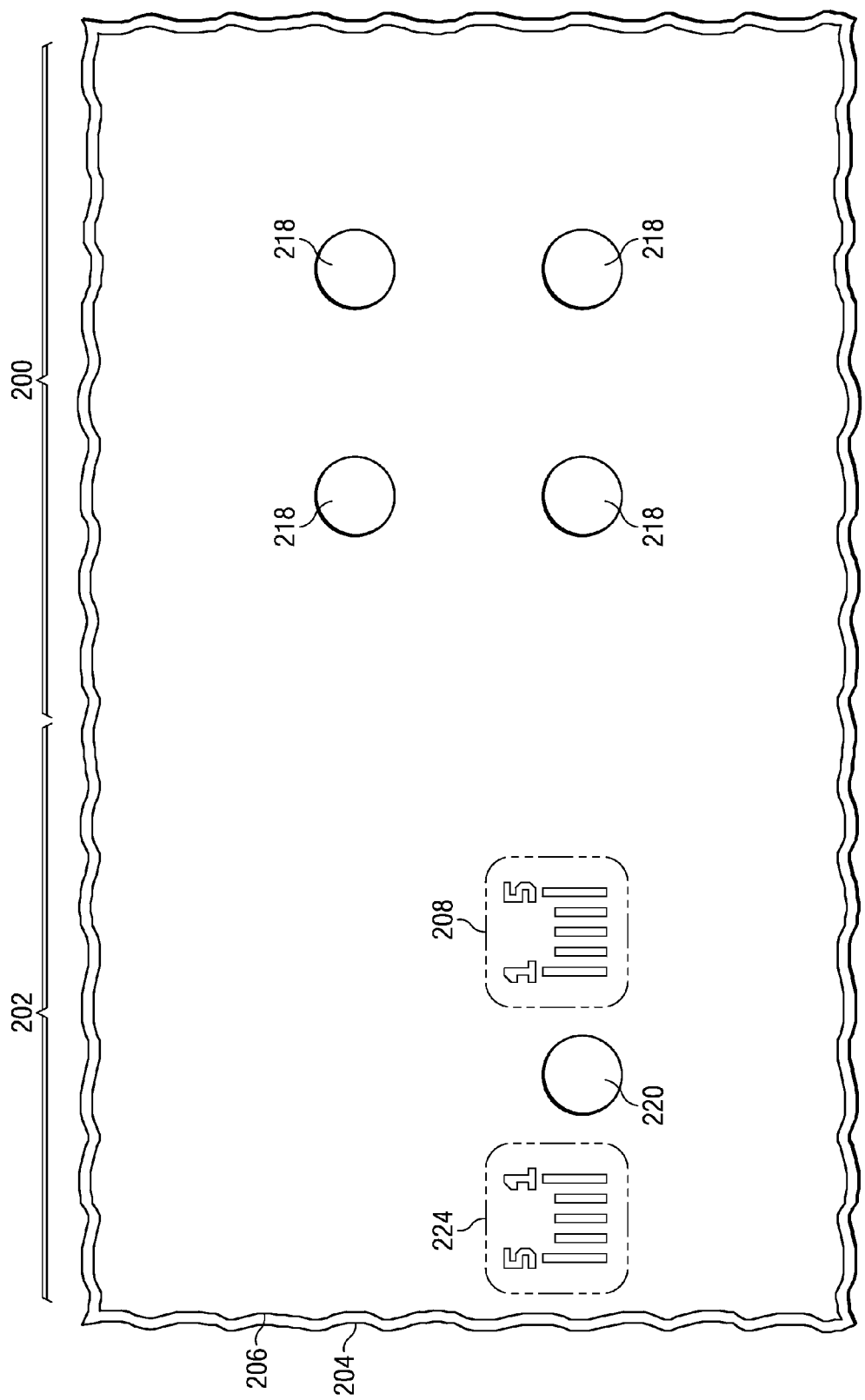

FIG. 2E is a top view of the MEMS device 200 and the cavity etch monitor 202 at a subsequent stage of fabrication. An optional second monitor scale 224 may be formed after the access hole etch process is completed. The second monitor scale 224 is adjacent to an instance of the monitor access hole 220. The second monitor scale 224 may be adjacent to the same instance of the monitor access hole 220 as the first monitor scale 208, or may be adjacent to a different instance of the monitor access hole 220, if present.

FIG. 2F is a cross section of the MEMS device 200 and the cavity etch monitor 202 at the same stage of fabrication depicted in FIG. 2E. The second monitor scale 224 may be formed, for example, by etching scale indicia into a top surface of the overlying layer 206.

Figure 2G:
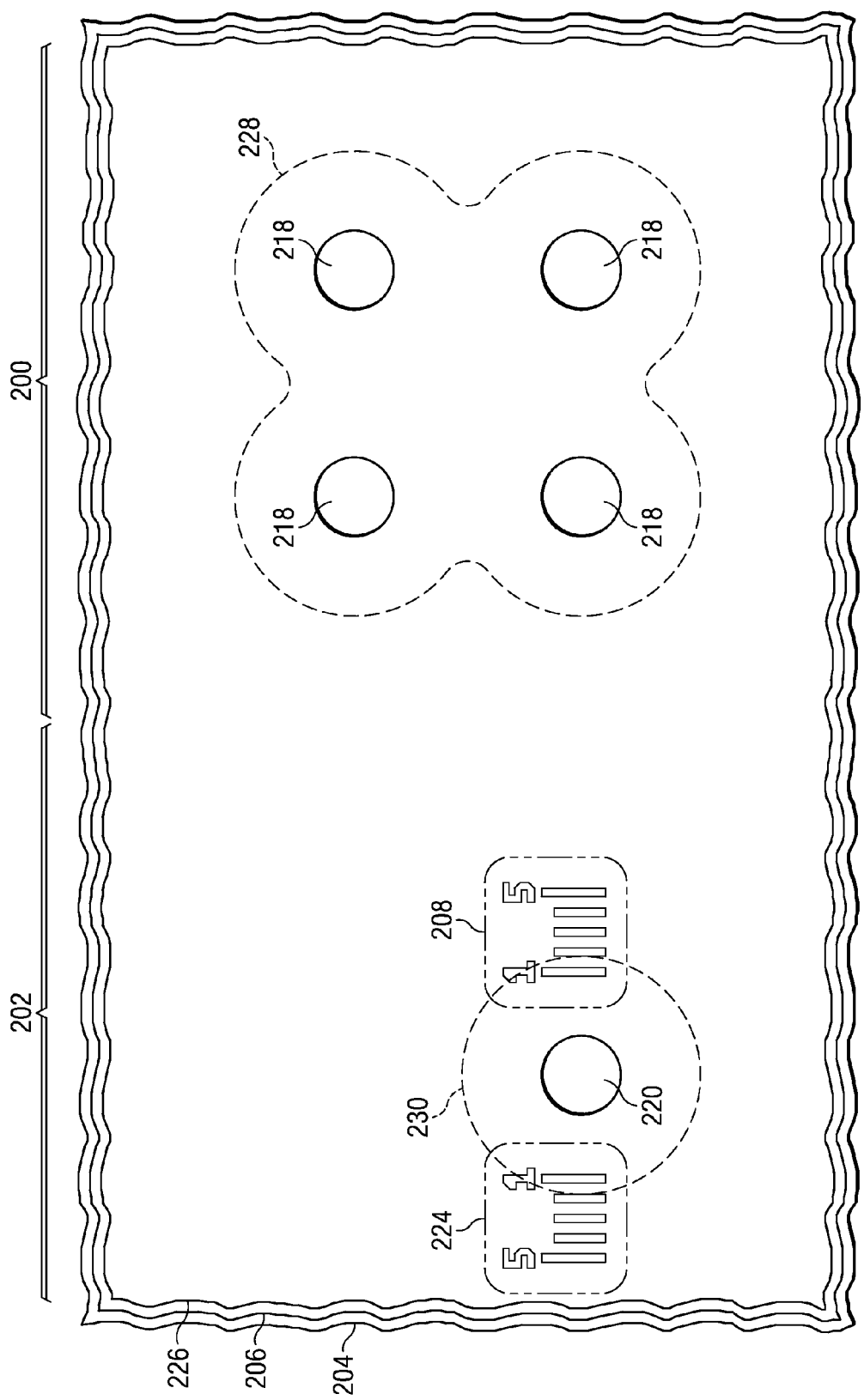

FIG. 2G is a top view of the MEMS device 200 and the cavity etch monitor 202 at a subsequent stage of fabrication. A cavity etch mask 226 is formed over the overlying layer 206 so as to expose areas in the device access holes 218 and the monitor access hole 220. The cavity etch mask 226 may be the access hole etch mask 216. Alternatively, the cavity etch mask 226 may be formed over the access hole etch mask 216. In a further alternative, the access hole etch mask 216 may be removed and the cavity etch mask 226 may be formed on the overlying layer 206. A cavity etch process is performed which removes any remaining material of the overlying layer 206 in the exposed areas and subsequently removes material from the substrate 204 so as to form a device cavity 228 underlapping the overlying layer 206 around the device access holes 218 and to concurrently form a monitor cavity 230 underlapping the overlying layer 206 around the monitor access holes 220.

FIG. 2H is a cross section of the MEMS device 200 and the cavity etch monitor 202 at the same stage of fabrication depicted in FIG. 2G. A lateral edge 234 of the monitor cavity 230 under the first monitor scale 208, and the second monitor scale 224 if present, are visually observable through the overlying layer 206. A lateral extent the lateral edge 234 of the monitor cavity 230 under the overlying layer 206 is related to a lateral extent of the lateral edge 232 of the device cavity 228 under the overlying layer 206.

Figure 2I:
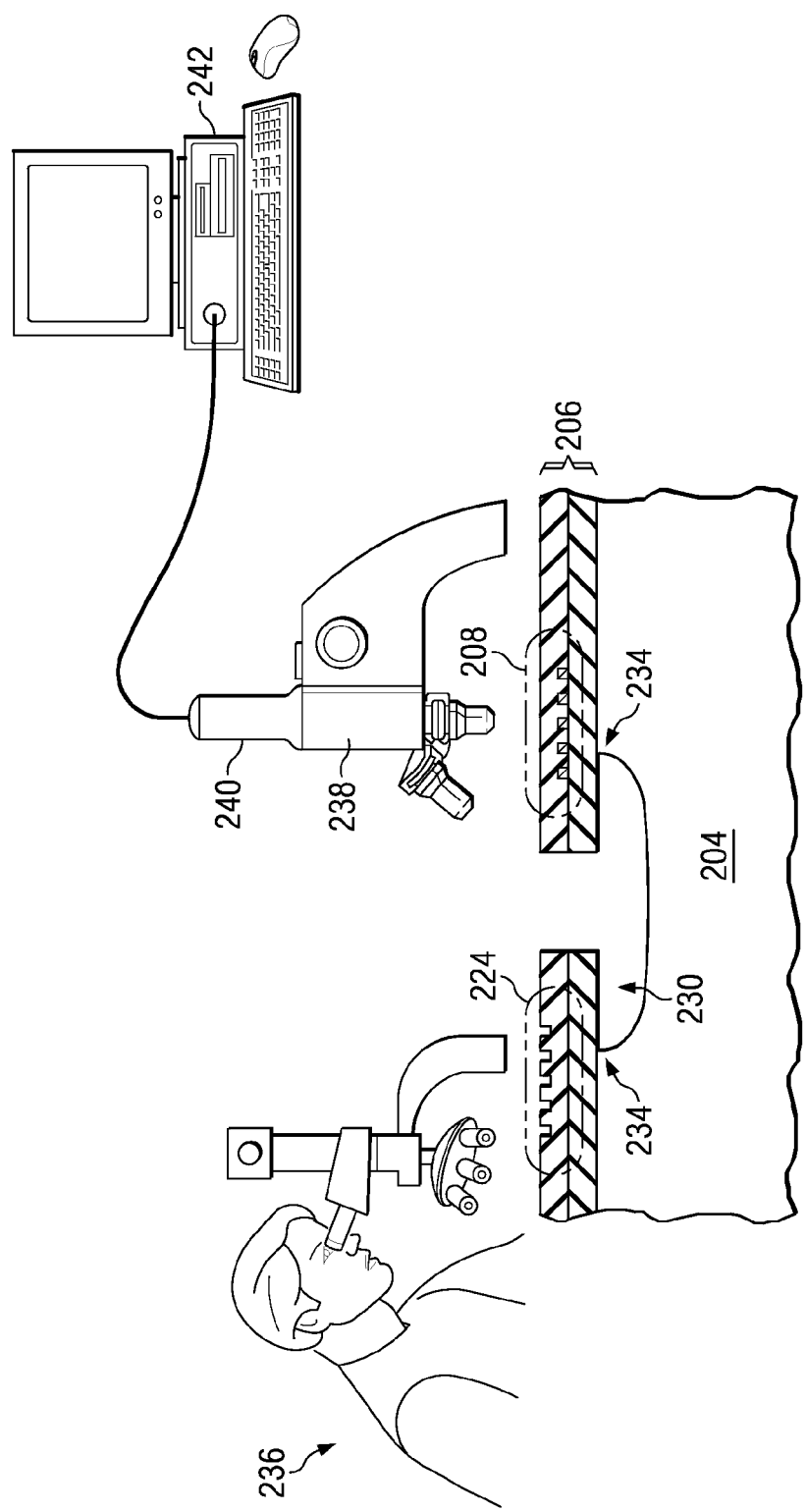

FIG. 2I depicts a cavity etch monitor inspection operation in which a position of the lateral edge 234 of the monitor cavity 230 with respect to the first monitor scale 208, and possibly the second monitor scale 224 if present, is determined by visual observation through the overlying layer 206. The cavity etch monitor inspection operation may be performed by a human 236 using, for example, an optical microscope. Alternatively, the cavity etch monitor inspection operation may be performed in an automated manner using an optical microscope 238 with a camera 240 connected to a computer 242. The cavity etch mask 226 may be removed prior to the cavity etch monitor inspection operation, or, alternately, the cavity etch mask 226 may be left in place during the cavity etch monitor inspection operation.

Figure 2J:
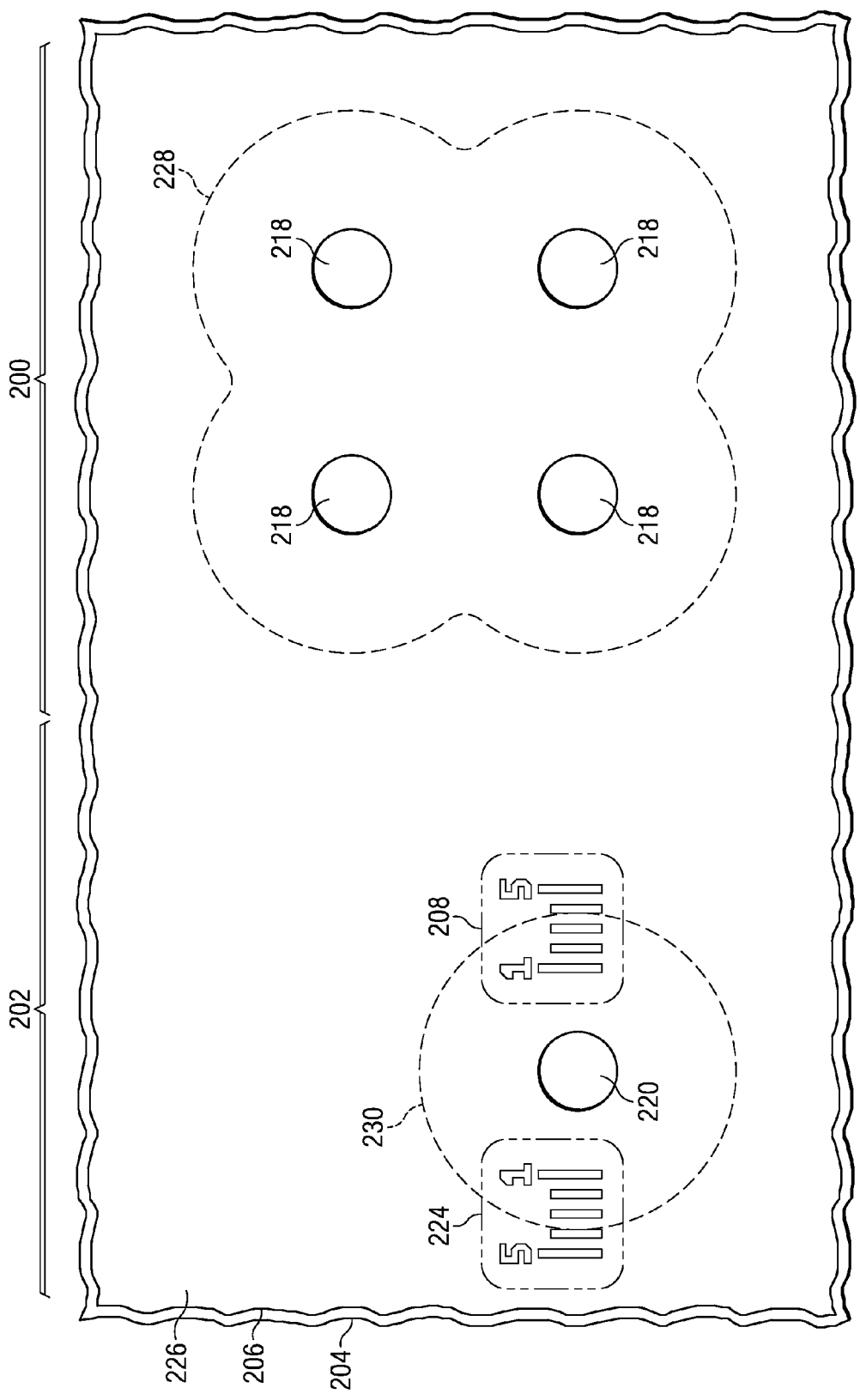

Based on results of the cavity etch monitor inspection operation, an additional cavity etch process may be performed. For example, extent of the lateral edge 234 of the monitor cavity 230 as depicted in FIG. 2G and FIG. 2H may indicate an insufficiently wide device cavity 228. An additional cavity etch process may be performed to produce a wider device cavity, as depicted in FIG. 2J and FIG. 2K. FIG. 2J is a top view of the MEMS device 200 and the cavity etch monitor 202 after an additional cavity etch process is performed, producing a device cavity 228 within a desired width range. FIG. 2K is a cross section of the MEMS device 200 and the cavity etch monitor 202 at the same stage of fabrication depicted in FIG. 2J. The cavity etch monitor inspection operation described in reference to FIG. 2I may be repeated after the additional cavity etch process is performed.

Figure 2L:
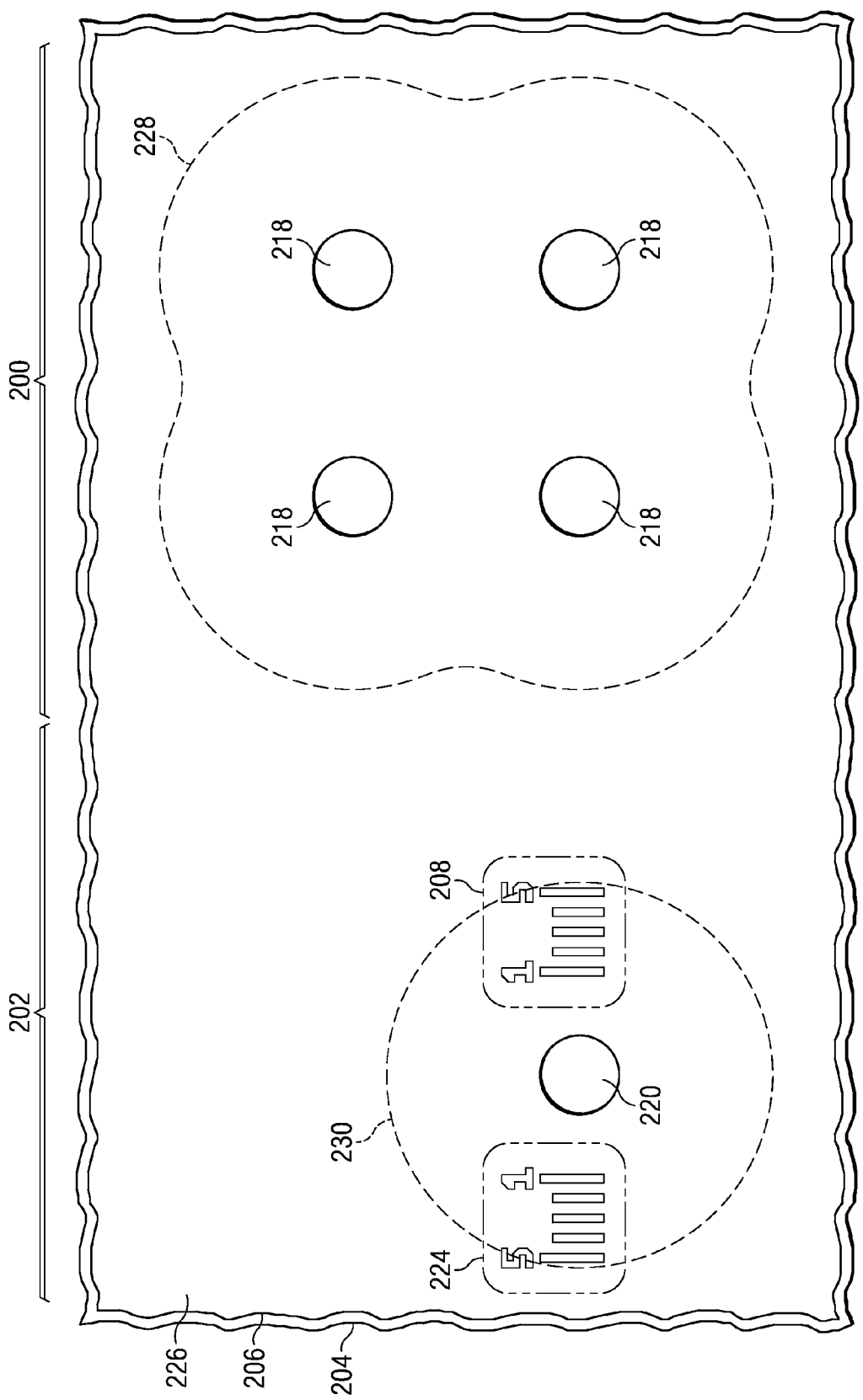

Based on results of the cavity etch monitor inspection operation, a decision may be made to terminate fabrication of the MEMS device 200, for example if the results of the cavity etch monitor inspection operation indicate the device cavity 228 is wider than an acceptable range. FIG. 2L is a top view of the MEMS device 200 and the cavity etch monitor 202 in which the device cavity 228 is wider than an acceptable range. A position of the lateral edge of the monitor cavity 230 under the first monitor scale 208, and under the second monitor scale 224 if present, is outside an acceptable range of positions with respect to the scale indicia of the monitor scales 208 and 224. FIG. 2M is a cross section of the MEMS device 200 and the cavity etch monitor 202 at the same stage of fabrication depicted in FIG. 2L. Performing the cavity etch monitor inspection operation on the cavity etch monitor 202 of FIG. 2L and FIG. 2M may provide results that indicate the device cavity 228 is wider than the acceptable range, and so fabrication of the MEMS device 200 may be terminated.

Figure 3A:
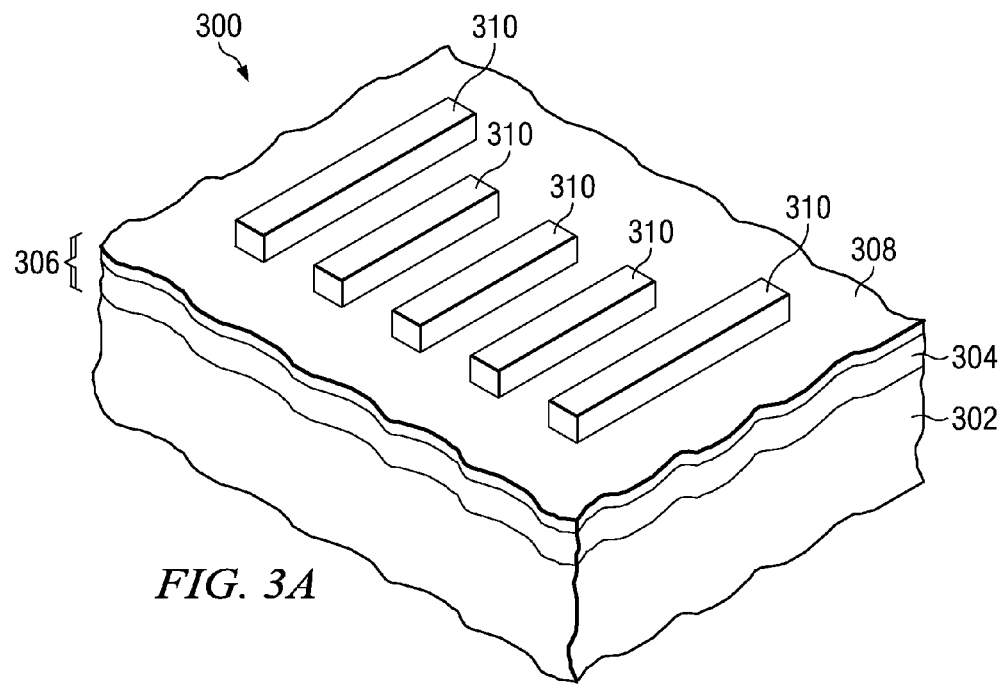
FIG. 3A through FIG. 3C depict fabrication steps for forming a monitor scale.
Figure 3B:
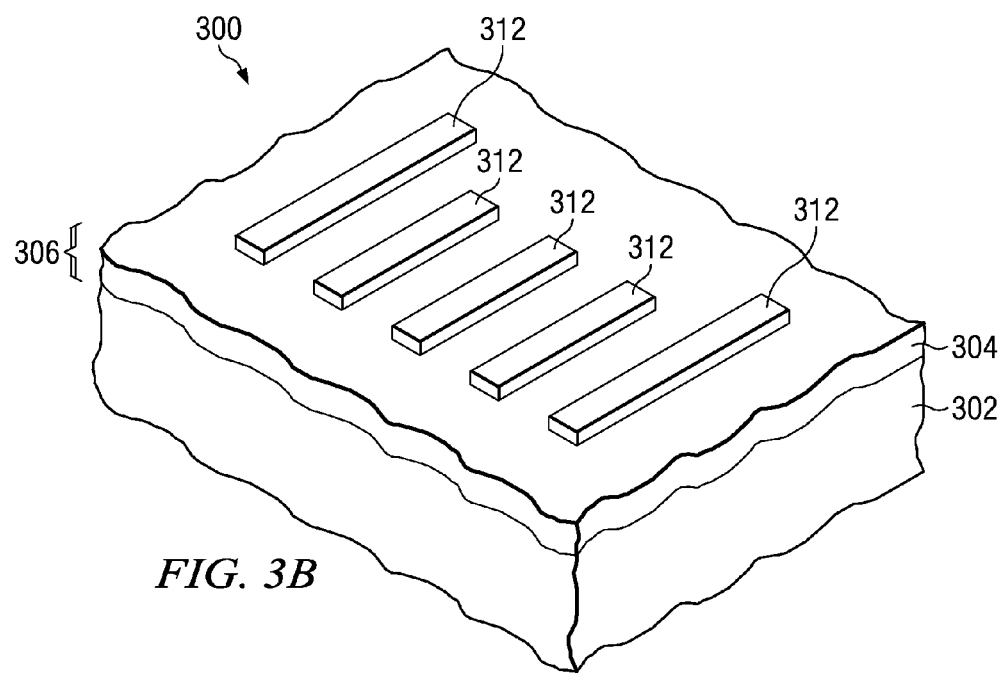
Figure 3C:
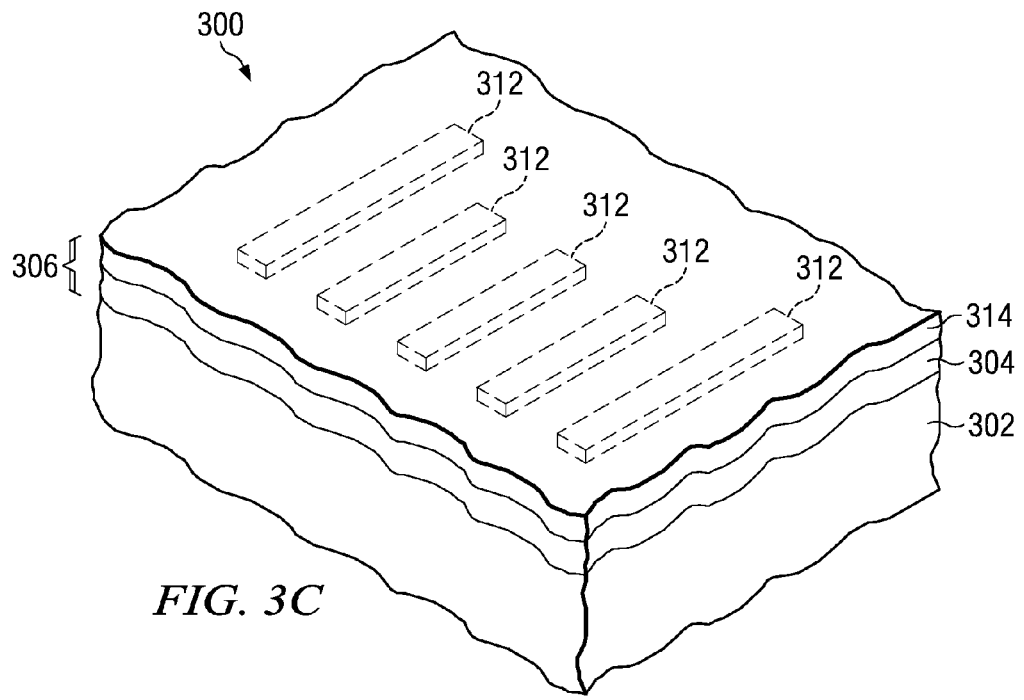

FIG. 3A through FIG. 3C depict fabrication steps for forming a monitor scale. Referring to FIG. 3A, a cavity etch monitor 300 is formed in and on a substrate 302 as described in reference to FIG. 1. A first sublayer 304 of overlying layer 306 is formed over the substrate 302. The first sublayer 304 is sufficiently transparent so as to allow inspection of a lateral edge of a monitor cavity. The first sublayer 304 may include, for example, one or more sublayers of silicon dioxide, silicon nitride, silicon oxynitride and/or aluminum oxide.

A contrast layer 308 such as metal, polysilicon or silicon carbide is formed over the first sublayer 304. The contrast layer 308 may be used to form circuit components in a MEMS device proximate to the cavity etch monitor. An indicia etch mask 310 is formed over the contrast layer 308 so as to cover areas for scale indicia of the cavity etch monitor 300. The indicia etch mask 301 may include photoresist and be formed concurrently with etch masks for the circuit components using the contrast layer 308. The indicia etch mask 310 may be formed, for example, using a photolithographic process. The indicia etch mask 310 may also include numerals or other characters.

Referring to FIG. 3B, an etch process is performed which removes material from the contrast layer 308 to form scale indicia 312 in areas defined by the indicia etch mask 310. The indicia etch mask 310 is removed after the etch process is completed.

Referring to FIG. 3C, an optional second dielectric sublayer 314 of the overlying layer 306 may be formed over the first sublayer 304 and over the scale indicia 312. The second sublayer 314 is sufficiently transparent so as to allow inspection of a lateral edge of a monitor cavity. The second sublayer 314 may include, for example, one or more sublayers of silicon dioxide, silicon nitride and/or silicon oxynitride.

As is known in the art, a metal damascene process may alternately be used to form the scale indicia 312. For example, the scale indicia 312 may be formed using a tungsten damascene process which includes forming indicia trenches in the overlying layer 306, forming a titanium-containing liner in the trenches and over the overlying layer 306, depositing tungsten on the liner in the trenches and over the overlying layer 306 by metal-organic chemical vapor deposition (MOCVD), and removing the tungsten and liner from over the overlying layer 306 using etchback and/or chemical-mechanical polishing (CMP) processes. In another example, the scale indicia 312 may be formed using a copper damascene process which includes forming the indicia trenches in the overlying layer 306, forming a tantalum-containing liner in the trenches and over the overlying layer 306, sputtering a copper seed layer on the liner, electroplating copper on the seed layer in the trenches and over the overlying layer 306, and removing the copper and liner from over the overlying layer 306 using a CMP process.

Figure 4A:
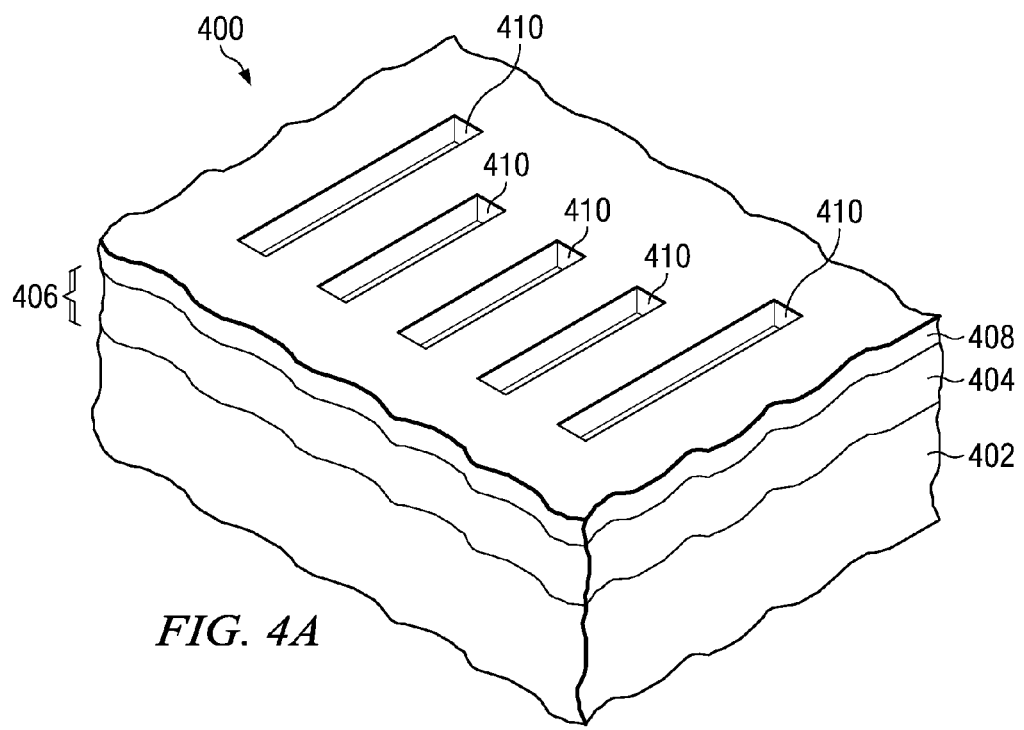
FIG. 4A through FIG. 4C depict alternate fabrication steps for forming a monitor scale.
Figure 4B:
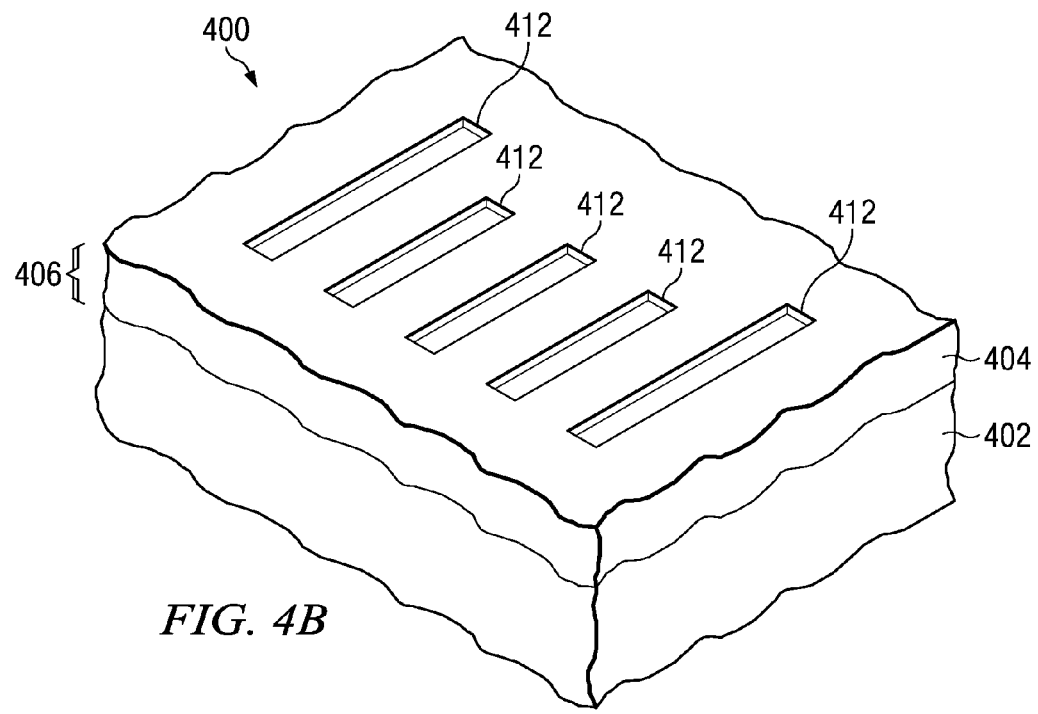
Figure 4C:
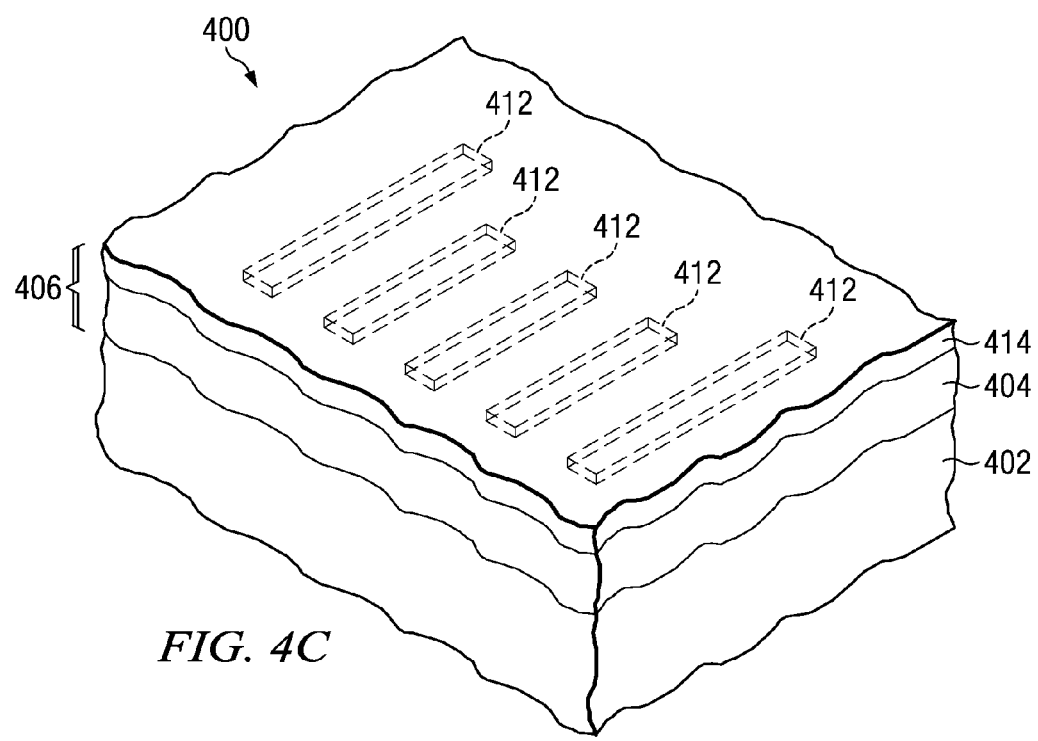

FIG. 4A through FIG. 4C depict alternate fabrication steps for forming a monitor scale. Referring to FIG. 4A, a cavity etch monitor 400 is formed in and on a substrate 402 as described in reference to FIG. 1. A first dielectric sublayer 404 of overlying layer 406 is formed over the substrate 402. The first sublayer 404 is sufficiently transparent so as to allow inspection of a lateral edge of a monitor cavity. The first sublayer 404 may include, for example, one or more sublayers of silicon dioxide, silicon nitride, silicon oxynitride and/or aluminum oxide.

An indicia etch mask 408 is formed over the first sublayer 404 so as to expose indicia areas 410 for scale indicia of the cavity etch monitor 400. The indicia etch mask 408 may include photoresist and be formed, for example, using a photolithographic process. The indicia etch mask 408 may also expose areas for numerals or other characters.

Referring to FIG. 4B, an etch process is performed which removes material from the first sublayer 404 in the indicia areas 401 so as to form trench indicia 412 etched into the first dielectric sublayer 404. The indicia etch mask 408 is removed after the etch process is completed.

Referring to FIG. 4C, an optional second dielectric sublayer 414 of the overlying layer 406 may be formed over the first sublayer 404 and over the scale indicia 412. The second sublayer 414 is sufficiently transparent so as to allow inspection of a lateral edge of a monitor cavity. The second sublayer 414 may include, for example, one or more sublayers of silicon dioxide, silicon nitride and/or silicon oxynitride. A material at a bottom surface of the second sublayer 414 preferably has a different index of refraction from a material at a top surface of the first sublayer 404 so as to increase an optical contrast of the scale indicia 412.

Figure 5:
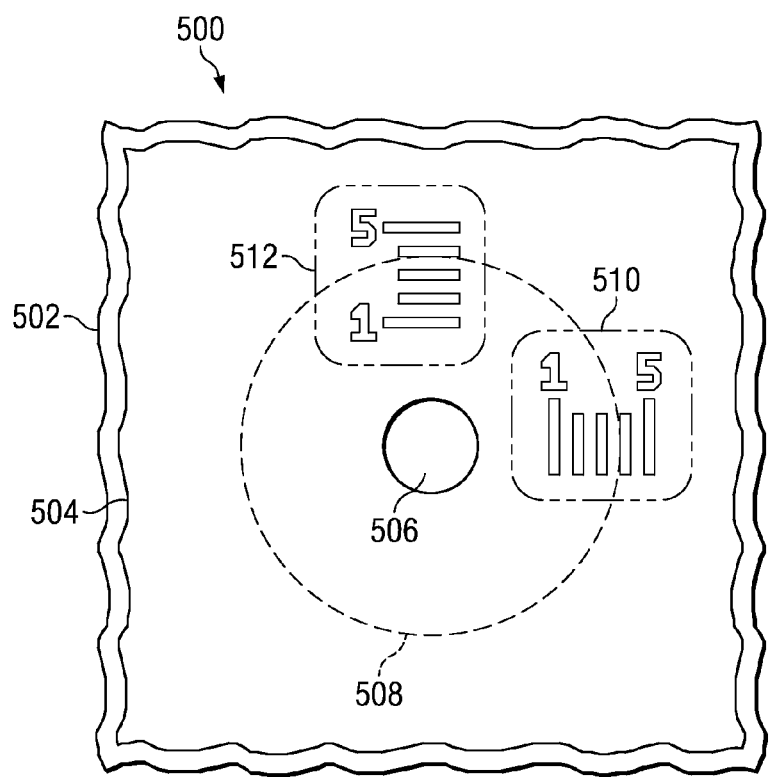
FIG. 5 and FIG. 6 depict alternate examples of monitor scales in cavity etch monitors.
Figure 6:
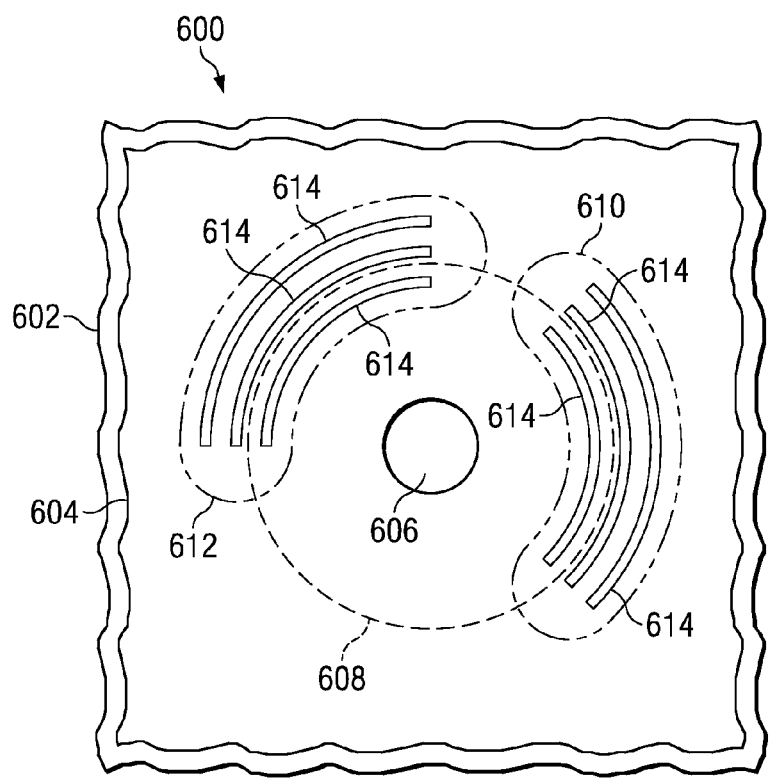

FIG. 5 and FIG. 6 depict alternate examples of monitor scales in cavity etch monitors. Referring to FIG. 5, a cavity etch monitor 500 is formed in and on a substrate 502 as described in reference to FIG. 1. An overlying layer 504 is formed over the substrate 502. The cavity etch monitor 500 includes at least one monitor access hole 506 through the overlying layer 504 and a monitor cavity 508 in the substrate around the monitor access hole 506, as described in reference to FIG. 1.

The cavity etch monitor 500 includes a first monitor scale 510 in a first orientation disposed over a lateral edge of the monitor cavity 508 and a second monitor scale 512 in a second orientation different from the first orientation disposed over the lateral edge of the monitor cavity 508. The first monitor scale 510 and the second monitor scale 512 may be formed, for example, as described in reference to FIG. 3A through FIG. 3C or FIG. 4A through FIG. 4C. Forming the cavity etch monitor 500 with two monitor scales 510 and 512 may advantageously provide a more accurate estimate of a lateral width of a device cavity proximate to the cavity etch monitor 500. Forming the two monitor scales 510 and 512 with different orientations may advantageously provide a more accurate estimate of the device cavity lateral width in cases of orientation dependent etching during formation of the device cavity and the monitor cavity 508.

Referring to FIG. 6, a cavity etch monitor 600 is formed in and on a substrate 602 with an overlying layer 604 over the substrate 602, at least one monitor access hole 606 through the overlying layer 604 and a monitor cavity 608 in the substrate around the monitor access hole 606, as described in reference to FIG. 1. The cavity etch monitor 600 includes a first monitor scale 610 in an arc configuration in a first orientation disposed over a lateral edge of the monitor cavity 608, and a second monitor scale 612 in an arc configuration in a second orientation disposed over the lateral edge of the monitor cavity 608. In the arc configuration, the scale indicia 614 have circle segment shapes centered on a center of the monitor access hole 606. The first monitor scale 610 and the second monitor scale 612 may be formed, for example, as described in reference to FIG. 3A through FIG. 3C or FIG. 4A through FIG. 4C. Forming the first monitor scale 610 and the second monitor scale 612 in the arc configuration may advantageously facilitate determination of a position of the lateral edge of the monitor cavity 608 with respect to the scale indicia 614 during performance of a cavity etch monitor inspection operation.

Figure 8:
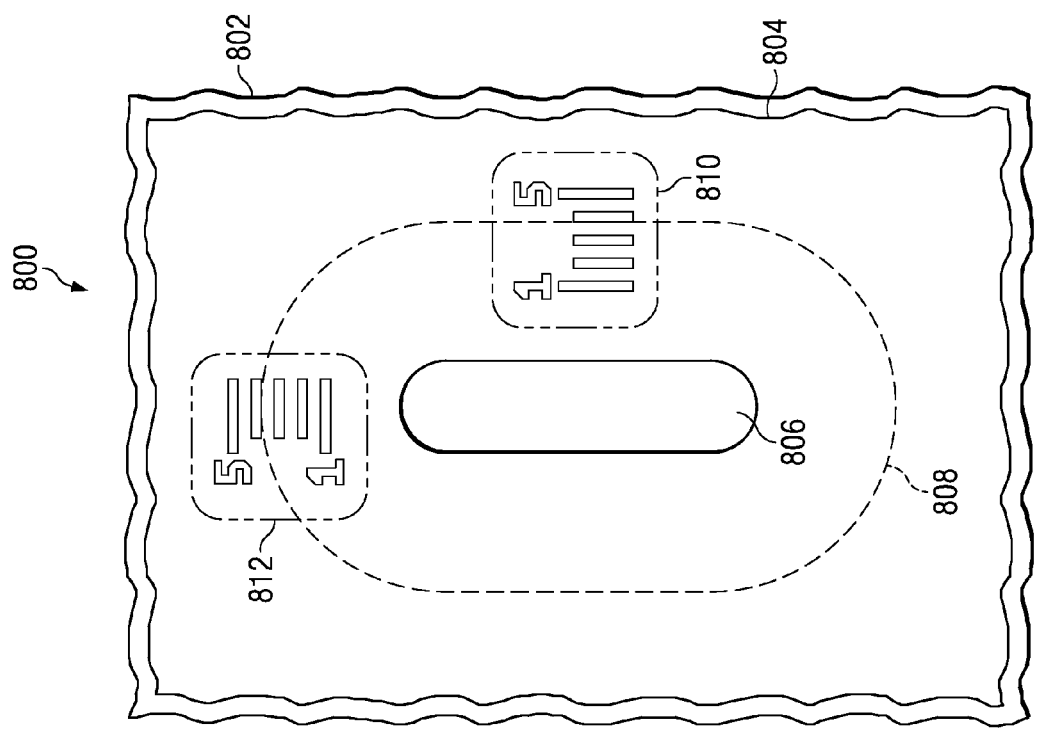
FIG. 7 and FIG. 8 depict further examples of monitor scales in cavity etch monitors.
Figure 7:
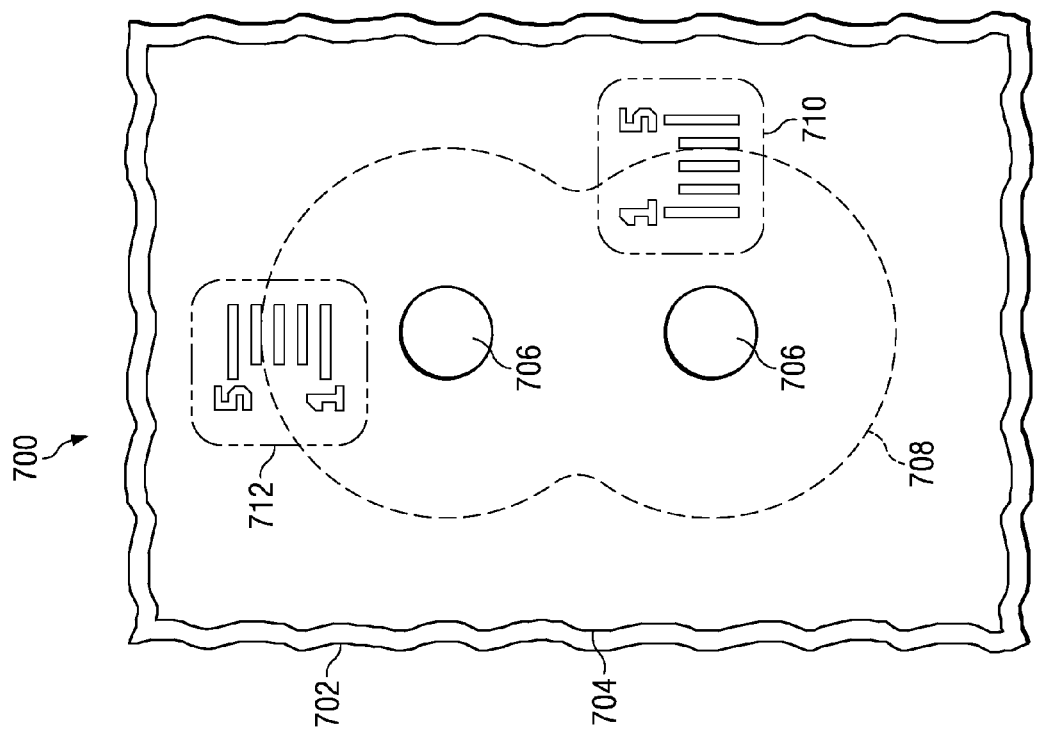

FIG. 7 and FIG. 8 depict further examples of monitor scales in cavity etch monitors. Referring to FIG. 7, a cavity etch monitor 700 is formed in and on a substrate 702 as described in reference to FIG. 1. An overlying layer 704 is formed over the substrate 702. The cavity etch monitor 700 includes a plurality of monitor access holes 706 through the overlying layer 704 and a monitor cavity 708 in the substrate around the monitor access holes 706. The cavity etch monitor 700 includes a first monitor scale 710 in a first orientation proximate to a first instance of the monitor access holes 706 disposed over a lateral edge of the monitor cavity 708 and a second monitor scale 712 in a second orientation, possibly different from the first orientation, proximate to a second instance of the monitor access holes 706 disposed over the lateral edge of the monitor cavity 708. Forming the cavity etch monitor 700 with a plurality of access holes 706 may advantageously provide a more accurate relationship between a width of the monitor cavity 708 and a device cavity in a MEMS device proximate to the cavity etch monitor 700. Forming the cavity etch monitor 700 with two monitor scales 710 and 712 having different orientations may advantageously provide a more accurate estimate of the device cavity lateral width with respect to the monitor cavity 708.

Referring to FIG. 8, a cavity etch monitor 800 is formed in and on a substrate 802 with an overlying layer 804 over the substrate 802. The cavity etch monitor 800 includes an elongated monitor access hole 806 through the overlying layer 804 and a monitor cavity 808 in the substrate around the elongated monitor access hole 806. Forming the monitor access hole 806 with an elongated shape may advantageously provide a more accurate relationship between a width of the monitor cavity 808 and a device cavity in a MEMS device proximate to the cavity etch monitor 800, for example if the MEMS device has an elongated device access hole. The cavity etch monitor 800 includes a first monitor scale 810 disposed approximately midway along a length of the elongated monitor access hole 806, and a second monitor scale 812 disposed at an end of the elongated monitor access hole 806. Forming the cavity etch monitor 800 with the first monitor scale 810 along the length of the elongated monitor access hole 806 and the second monitor scale 812 at the end of the elongated monitor access hole 806 may advantageously provide a more accurate estimate of the device cavity lateral width with respect to the monitor cavity 808.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A microelectronic mechanical system (MEMS) device, comprising:
 a substrate;
 an overlying layer disposed over said substrate;
 a device access hole through said overlying layer;
 a device cavity in said substrate under said device access hole, such that said device cavity underlaps said overlying layer so that a lateral edge of said device cavity extends at least 5 microns past a lateral edge of said device access hole; and
 a cavity etch monitor disposed proximate to said device cavity, said cavity etch monitor comprising:
  a monitor access hole through said overlying layer;
  a monitor cavity in said substrate under said monitor access hole, such that said monitor cavity underlaps said overlying layer so that a lateral edge of said monitor cavity extends at least 5 microns past a lateral edge of said monitor access hole; and
  a first monitor scale disposed over said lateral edge of said monitor cavity, said first monitor scale including scale indicia to indicate a location of said lateral edge.

2. The MEMS device of claim 1, in which said scale indicia of said first monitor scale include metal.

3. The MEMS device of claim 1, in which said scale indicia of said first monitor scale include polysilicon.

4. The MEMS device of claim 1, in which said scale indicia of said first monitor scale are etched into a dielectric sublayer of said overlying layer.

5. The MEMS device of claim 1, in which said scale indicia of said first monitor scale are in a linear configuration.

6. The MEMS device of claim 1, in which said scale indicia of said first monitor scale are in an arc configuration.

7. The MEMS device of claim 1, in which said cavity etch monitor further includes a second monitor scale disposed over said lateral edge of said monitor cavity, said second monitor scale including scale indicia.

8. A process for forming a MEMS device, comprising the steps of:
   forming a device access hole through an overlying layer;
   forming a device cavity in a substrate from said device access hole, wherein said device cavity extends beyond a lateral edge of said device access hole by at least 5 microns; and
   forming a cavity etch monitor, wherein forming the cavity etch monitor includes:
      forming a first monitor scale having scale indicia;
      forming a monitor cavity in said substrate that extends under said first monitor scale, such that said monitor scale indicates a lateral edge of said monitor cavity which in turn indicates a lateral edge of said device cavity.

9. The process of claim 8, wherein said first monitor scale is formed by a process including the steps of:
   forming a contrast layer on a first sublayer of said overlying layer;
   forming an indicia etch mask over the contrast layer so as to cover areas for said scale indicia of said first monitor scale; and
   performing an etch process to form said scale indicia in areas defined by said indicia etch mask.

10. The process of claim 9, wherein forming said cavity etch monitor further comprises forming a second monitor scale at a second sublayer of said overlying layer.

11. The process of claim 9, wherein said contrast layer comprises metal.

12. The process of claim 9, wherein said contrast layer comprises polysilicon.

13. The process of claim 8, wherein said first monitor scale is formed by:
   forming a first sublayer of said overlying layer; and
   removing portions of said first sublayer using a mask to form said scale indicia in said first sublayer.

14. The process of claim 13, wherein forming said cavity etch monitor further comprises forming a second monitor scale.

15. The process of claim 8, wherein said scale indicia are formed in a linear configuration.

16. The process of claim 8, wherein said scale indicia are formed in an arc configuration.

17. A process of forming a MEMS device, comprising the steps of:
   providing a substrate;
   forming an overlying layer over said substrate, said overlying layer having transparent regions;
   forming a first monitor scale over said substrate, said first monitor scale being part of a cavity etch monitor, said first monitor scale including scale indicia;
   forming an access hole etch mask over said overlying layer, such that said access hole etch mask exposes said overlying layer in areas for at least one device access hole and at least one monitor access hole, said monitor access hole being proximate to said first monitor scale, said monitor access hole being part of said cavity etch monitor;
   performing an access hole etch process which removes material from said overlying layer in said at least one device access hole area and said at least one monitor access hole area; and
   performing a cavity etch process which removes material from said substrate so as to form a device cavity underlapping said overlying layer around said at least one device access hole and to concurrently form a monitor cavity underlapping said overlying layer around said at least one monitor access hole, said monitor cavity being part of said cavity etch monitor.

18. The process of claim 17, further including the step of performing a cavity etch monitor inspection operation after said step of performing a cavity etch process, in which a position of a lateral edge of said monitor cavity with respect to said first monitor scale is determined by visual observation through said overlying layer.

19. The process of claim 18, further including the step of performing an additional cavity etch process based on results from said cavity etch monitor inspection operation.

20. The process of claim 18, further including the step of forming a second monitor scale over said substrate, said second monitor scale being part of said cavity etch monitor, said second monitor scale including scale indicia.

* * * * *